United States Patent
Yang et al.

(10) Patent No.: US 12,341,607 B2
(45) Date of Patent: Jun. 24, 2025

(54) LINEAR-CODE-BASED PROBABILISTIC SHAPING

(71) Applicant: QUALCOMM Incorporated, San Diego, CA (US)

(72) Inventors: Wei Yang, San Diego, CA (US); Jing Jiang, San Diego, CA (US); Thomas Joseph Richardson, South Orange, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/470,616

(22) Filed: Sep. 20, 2023

(65) Prior Publication Data

US 2025/0096931 A1    Mar. 20, 2025

(51) Int. Cl.
*H04L 1/00*     (2006.01)

(52) U.S. Cl.
CPC .................. *H04L 1/0057* (2013.01)

(58) Field of Classification Search
CPC ..................................... H04L 1/0057
See application file for complete search history.

(56) References Cited

U.S. PATENT DOCUMENTS

| | | | | |
|---|---|---|---|---|
| 2015/0039970 A1* | 2/2015 | Sharon | ................ | G11C 16/10 714/773 |
| 2021/0211229 A1* | 7/2021 | Doan | ................ | H04L 27/3405 |
| 2021/0243058 A1* | 8/2021 | Doan | ................ | H04L 1/0057 |
| 2023/0033774 A1* | 2/2023 | Koike-Akino | ......... | H04L 27/36 |
| 2024/0243842 A1* | 7/2024 | Sen | ................ | H04L 1/0042 |

OTHER PUBLICATIONS

Bobrov E., et al., "On Probability Shaping for 5G MIMO Wireless Channel with Realistic LDPC Codes", arXiv:2303.02598v2, Cornell University Library, 201 Olin Library Cornell University Ithaca, NY 14853, May 29, 2023, 14 Pages, XP091521426, The Whole Document.

Braunstein A., et al., "Efficient LDPC Codes over GF(q) for Lossy Data Compression", IEEE International Symposium on Information Theory, Jun. 1, 2009, pp. 1978-1982, XP093222012, Piscataway, NJ, USA DOI: 10.1109/ISIT.2009.5205707 ISBN: 978-1-4244-4312-3, the whole document.

Goukhshtein M., et al., "Polar Coded Distribution Matching for Probabilistic Shaping and Stealth Communication", 12th International Symposium on Topics in Coding (ISTC), Sep. 4, 2023, 5 Pages, XP034442260, DOI: 10.1109/ISTC57237.2023.10273544, the whole document.

(Continued)

*Primary Examiner* — Thien Nguyen
(74) *Attorney, Agent, or Firm* — Haynes and Boone, LLP

(57) ABSTRACT

A transmitter is provided that shapes uniformly-distributed bits into a non-uniformly distributed bits according to a parity check matrix of a linear code such that a product of the parity check matrix and the non-uniformly distributed bits equals the uniformly-distributed bits. Similarly, receiver is provided that recovers the uniformly-distributed bits from the non-uniformly distributed bits through a multiplication of the non-uniformly-distributed bits with the parity check matrix.

18 Claims, 6 Drawing Sheets

(56) References Cited

OTHER PUBLICATIONS

Goukhshtein M., et al., "Rate-Energy Optimal Probabilistic Shaping Using Linear Codes", IEEE International Symposium on Information Theory (ISIT), Jun. 26, 2022, pp. 790-795, XP034160516, DOI: 10.1109/ISIT50566.2022.9834402, the whole document.

International Search Report and Written Opinion—PCT/US2024/042883—ISA/EPO—Nov, 15, 2024.

Matsunaga Y., et al., "A Coding Theorem for Lossy Data Compression by LDPC Codes", IEEE Transactions on Information Theory, IEEE, USA, vol. 49, No. 9, Sep. 1, 2003, pp. 2225-2229, XP011100221, ISSN: 0018-9448, DOI: 1-3010.1109/TIT.2003.815805, the whole document.

Miyake S., et al., "Lossy Data Compression Over Zq by LDPC Code", IEEE International Symposium on Information Theory, PI, Jul. 1, 2006, pp. 813-816, XP031032323, ISBN: 978-1-4244-0505-3, the whole document.

Wiegart T., et al., "Probabilistic Shaping for Asymmetric Channels and Low-Density Parity-Check Codes", Arxiv.Org, Cornell University Library, 201 Olin Library Cornell University Ithaca, NY 14853, May 22, 2023, 6 Pages, XP091516016, The whole document.

* cited by examiner

LINEAR-CODE-BASED PROBABILISTIC SHAPING

TECHNICAL FIELD

This application relates to wireless communication systems, and more particularly to a wireless communication system with a linear-code-based probabilistic shaping.

INTRODUCTION

Although modern communication standards such as the New Radio (NR) $5^{th}$ generation (5G) standard are utilizing additional frequency bands as compared to older standards, the communication is still bandwidth limited. The resulting bandwidth limitation over which transmissions must occur restricts the theoretically achievable data rates. To approach this theoretical minimum through increased spectral efficiency, 5G systems may use higher-order modulation schemes in which bits are encoded to form a symbol. For example, in an M-ary quadrature amplitude modulation (QAM), M bits are encoded to form a symbol selected from a constellation of $2^M$ possible QAM symbols, where M is a positive integer.

Should each symbol in the constellation have the same probability of being transmitted, a "shaping gap" occurs that reduces the spectral efficiency by up to 1.53 dB. To reduce or eliminate this shaping gap, higher-order modulation schemes may utilize probabilistic shaping in which the distribution is still uniform but the spacing between points in the constellation is adjusted. Since adjusting the spacing of the constellation increases complexity and has other issues, an alternate technique in which the constellation spacing is unaffected is probabilistic amplitude shaping (PAS). In PAS, an outer layer of amplitude shaping maps input bits into amplitudes that have a non-uniform distribution (ideally, a Gaussian distribution). These amplitudes are then binary encoded to form a corresponding stream of information bits that are processed according to an inner layer of binary forward-error-correction (FEC) encoding to provide parity bits for a phasing of the amplitudes to create the symbol constellation.

SUMMARY

The following summarizes some aspects of the present disclosure to provide a basic understanding of the discussed technology. Its sole purpose is to present some concepts of one or more aspects of the disclosure in summary form as a prelude to the more detailed description that is presented later.

In one aspect of the disclosure, a transmitter is provided that includes: a decoder configured to decode a plurality of non-uniformly-distributed bits from a plurality of uniformly-distributed information bits so that a product of the plurality of non-uniformly-distributed bits with a parity check matrix for a linear code equals the plurality of uniformly-distributed information bits.

In another aspect of the disclosure, a receiver is provided that includes: a low-density parity-check encoder configured to multiply a plurality of non-uniformly-distributed bits with a parity check matrix for a low-density parity-check code to form a plurality of uniformly-distributed bits.

In yet another aspect of the disclosure, a method of shaping a plurality of uniformly-distributed bits is provided that includes: decoding a plurality of non-uniformly-distributed bits from the plurality of uniformly-distributed bits so that a product of the non-uniformly-distributed bits with a parity check matrix for a linear code equals the plurality of uniformly-distributed bits.

Finally, in accordance with yet another aspect of the disclosure, a transmitter is provided that includes: a decoder configured to decode a plurality of non-uniformly-distributed non-binary symbols from a plurality of uniformly-distributed non-binary information symbols so that a product of the plurality of non-uniformly-distributed non-binary symbols with a parity check matrix for a linear code equals the plurality of uniformly-distributed non-binary information symbols.

Other aspects, features, and embodiments of the disclosure will become apparent to those of ordinary skill in the art upon reviewing the following description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

Probabilistic shaping may be used in the transmission of non-uniformly distributed quadrature-amplitude-modulated (QAM) symbols. The resulting use of probabilistic shaping is quite advantageous as it increases the spectral efficiency. But implementing probabilistic shaping may introduce latency that may be challenging in high-speed data communication (for example, 10 gigabits per second). In particular, existing shaping techniques tend to be sequential so as to shape the bits bit by bit and thus have relatively large processing latency. A shaping technique is disclosed herein that is relatively low latency and is thus advantageous for modern high data rates.

The following discussion will focus on a shaping technique for probabilistic amplitude shaping, which is a form of probabilistic shaping (typically with QAM modulation) in which only the amplitude of the modulation is shaped to be non-uniform whereas the sign of the modulation is kept uniformly distributed. However, it will be appreciated that the shaping technique disclosed herein is applicable to probabilistic shaping in general without limitation to probabilistic amplitude shaping. Moreover, the shaping technique disclosed is application to any suitable modulation format such as phase-shift keying (PSK), frequency-shift keying (FSK), amplitude modulation, and so on.

Figure 1:
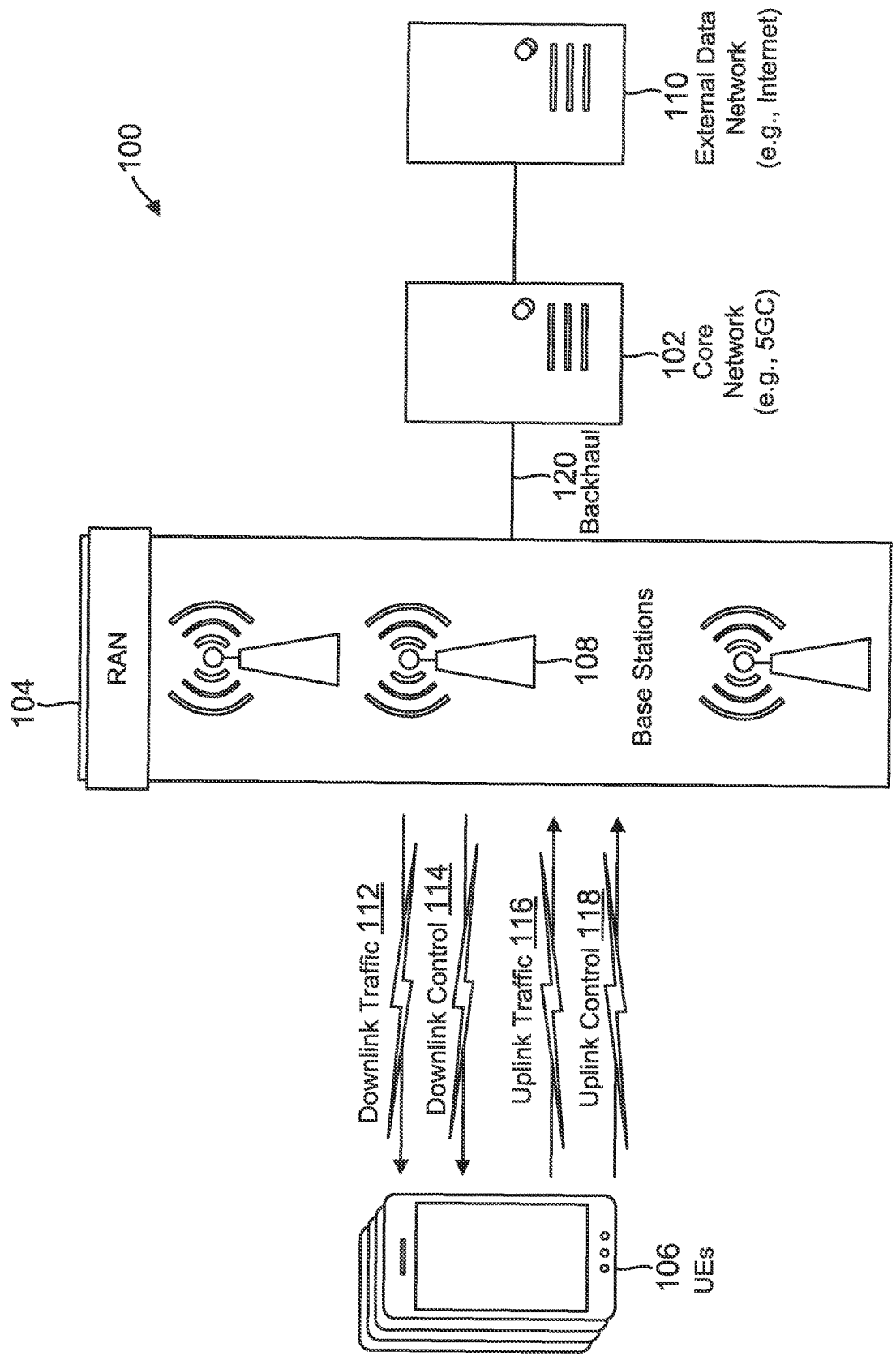
FIG. 1 illustrates an example communication system in which network nodes may practice code-based shaping and de-shaping according to an aspect of the disclosure.

To achieve an advantageous low latency, a plurality of uniformly-distributed information bits is shaped according to a linear code to form a plurality of non-uniformly distributed bits. However, the shaping according to a linear code as defined herein is not limited to the shaping of bits but may also be applied to the shaping of non-binary q-ary signals, where q equals $2^m$ and m is plural positive integer. Thus, although the following discussion will focus on the shaping of bits from a uniform distribution to a non-uniform distribution, it will be appreciated that the shaping disclosed herein is generally applicable to binary and non-binary vectors. With respect to the linear code, the following discussion will focus on the use of a low-density-parity-check (LDPC) code but it will be appreciated that other types of codes such as a low-density generator-matrix LDGM code, a Raptor code, or a concatenation of an LDPC code with an LDGM code may be used in encoder as will be further explained herein. Regardless of the type of linear code utilized, the transmitter shapes the plurality of uniformly-distributed information bits using a decoder for the linear code. Should the linear code be an LDPC code, the transmitter thus uses an LDPC encoder to form the shaped bits whereas the receiver uses a binary encoder to recover the uniformly-distributed information bits from the shaped bits. Before the code-based shaping and de-shaping is discussed in more detail, an example communication system in which communication devices may implement this advantageous shaping and de-shaping will first be discussed. Turning now to FIG. 1, various aspects of the present disclosure are illustrated with reference to a wireless communication system 100. The wireless communication system 100 includes three interacting domains: a core network 102, a radio access network (RAN) 104, and an external data network 110. RAN 104 includes a plurality of base stations 108 and a plurality of user equipment (UE) 106. Each UE 106 or base station 108 is an example of a network device configured to perform code-based shaping and de-shaping as discussed further herein.

By virtue of the wireless communication system 100, each UE 106 may be enabled to carry out data communication with the external data network 110, such as (but not limited to) the Internet. The RAN 104 may implement any suitable wireless communication technology or technologies to provide radio access to each UE 106. As one example, the RAN 104 may operate according to 3rd Generation Partnership Project (3GPP) New Radio (NR) specifications, often referred to as 5G. As another example, the RAN 104 may operate under a hybrid of 5G NR and Evolved Universal Terrestrial Radio Access Network (eUTRAN) standards, often referred to as LTE. The 3GPP refers to this hybrid RAN as a next-generation RAN, or NG-RAN. Of course, many other examples may be utilized within the scope of the present disclosure.

As illustrated, the RAN 104 includes a plurality of base stations 108. Broadly, a base station is a network device in a radio access network responsible for radio transmission and reception in one or more cells to or from a UE 106. In different technologies, standards, or contexts, a base station 108 may variously be referred to by those skilled in the art as a base transceiver station (BTS), a radio base station, a radio transceiver, a transceiver function, a basic service set (BSS), an extended service set (ESS), an access point (AP), a Node B (NB), an eNode B (eNB), a gNode B (gNB), or some other suitable terminology.

The radio access network 104 is further illustrated supporting wireless communication for multiple mobile apparatuses. A mobile apparatus may be referred to as user equipment (UE) in 3GPP standards, but may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. A UE 106 may be defined as an apparatus that provides a user with access to network services.

UEs 106 may include a number of components configured for wireless communication; such components can include antennas, antenna arrays, RF chains, amplifiers, one or more processors, etc. electrically coupled to each other. For example, some non-limiting examples of a mobile apparatus (mobile network device) include a cellular (cell) phone, a smart phone, a session initiation protocol (SIP) phone, a laptop, a personal computer (PC), a notebook, a netbook, a smartbook, a tablet, a personal digital assistant (PDA), and a broad array of embedded systems, e.g., corresponding to an "Internet of things" (IoT). A network device may additionally be an automotive or other transportation vehicle, a remote sensor or actuator, a robot or robotics device, a satellite radio, a global positioning system (GPS) device, an object tracking device, a drone, a multi-copter, a quad-copter, a remote control device, a consumer and/or wearable device, such as eyewear, a wearable camera, a virtual reality device, a smart watch, a health or fitness tracker, a digital audio player (e.g., MP3 player), a camera, a game console, etc. A network device may additionally be a digital home or smart home device such as a home audio, video, and/or multimedia device, an appliance, a vending machine, intelligent lighting, a home security system, a smart meter, etc.

Wireless communication between RAN 104 and a UE 106 may be described as utilizing an air interface. Transmissions over the air interface from a base station 108 to one or more UEs 106 may be referred to as downlink (DL) transmission. In accordance with certain aspects of the present disclosure, the term downlink may refer to a point-to-multipoint transmission originating at a base station 108. Another way to describe this scheme may be to use the term broadcast channel multiplexing. Transmissions from a UE 106 to a base station 108 may be referred to as uplink (UL) transmissions. In accordance with further aspects of the present disclosure, the term uplink may refer to a point-to-point or a point-to-multi-point transmission originating at a UE 106.

A base station 108 may thus broadcast downlink traffic 112 to one or more UEs 106. Broadly, each base station 108 is a node or device responsible for scheduling traffic in a wireless communication network, including the downlink traffic 112 and, in some examples, uplink traffic 116 and uplink control information 118 from the one or more UEs 106. On the other hand, each UE 106 is a node or device that receives downlink control information 114, including but not limited to scheduling information (e.g., a grant), synchronization or timing information, or other control information from another entity in the wireless communication network such as the base station 108.

Base stations 108 may include a backhaul interface for communication with a backhaul portion 120 of the wireless communication system. The backhaul 120 may provide a link between a base station 108 and the core network 102. Further, in some examples, a backhaul network may provide interconnection between the respective base stations 108. Various types of backhaul interfaces may be employed, such as a direct physical connection, a virtual network, or the like using any suitable transport network.

The core network 102 may be a part of the wireless communication system 100 and may be independent of the radio access technology used in the RAN 104. In some examples, the core network 102 may be configured according to 5G standards (e.g., 5GC). In other examples, the core network 102 may be configured according to a 4G evolved packet core (EPC), or any other suitable standard or configuration.

In various implementations, the air interface in the radio access network 104 may utilize licensed spectrum, unlicensed spectrum, or shared spectrum. Licensed spectrum provides for exclusive use of a portion of the spectrum, generally by virtue of a mobile network operator purchasing a license from a government regulatory body. Unlicensed spectrum provides for shared use of a portion of the spectrum without need for a government-granted license. While compliance with some technical rules is generally still required to access unlicensed spectrum, generally, any operator or device may gain access. Shared spectrum may fall between licensed and unlicensed spectrum, wherein technical rules or limitations may be required to access the spectrum, but the spectrum may still be shared by multiple operators and/or multiple RATs. For example, the holder of a license for a portion of licensed spectrum may provide licensed shared access (LSA) to share that spectrum with other parties, e.g., with suitable licensee-determined conditions to gain access.

The air interface in the radio access network 104 may utilize one or more duplexing algorithms. Duplex refers to a point-to-point communication link where both endpoints can communicate with one another in both directions. Full duplex means both endpoints can simultaneously communicate with one another. Half duplex means only one endpoint can send information to the other at a time. In a wireless link, a full duplex channel generally relies on physical isolation of a transmitter and receiver, and suitable interference cancellation technologies. Full duplex emulation is frequently implemented for wireless links by utilizing frequency division duplex (FDD) or time division duplex (TDD). In FDD, transmissions in different directions operate at different carrier frequencies. In TDD, transmissions in different directions on a given channel are separated from one another using time division multiplexing. That is, at one time the channel is dedicated for transmissions in one direction, while at other times the channel is dedicated for transmissions in the other direction, where the direction may change very rapidly, e.g., several times per slot. With this background information in mind, aspects of a transmitter implementing code-based shaping will first be discussed followed by a more detailed discussion of LDPC decoding for such de-shaping. Finally, a receiver implementing code-based de-shaping of the shaped bits to recover the uniformly-distributed bits will be discussed.

Figure 2:
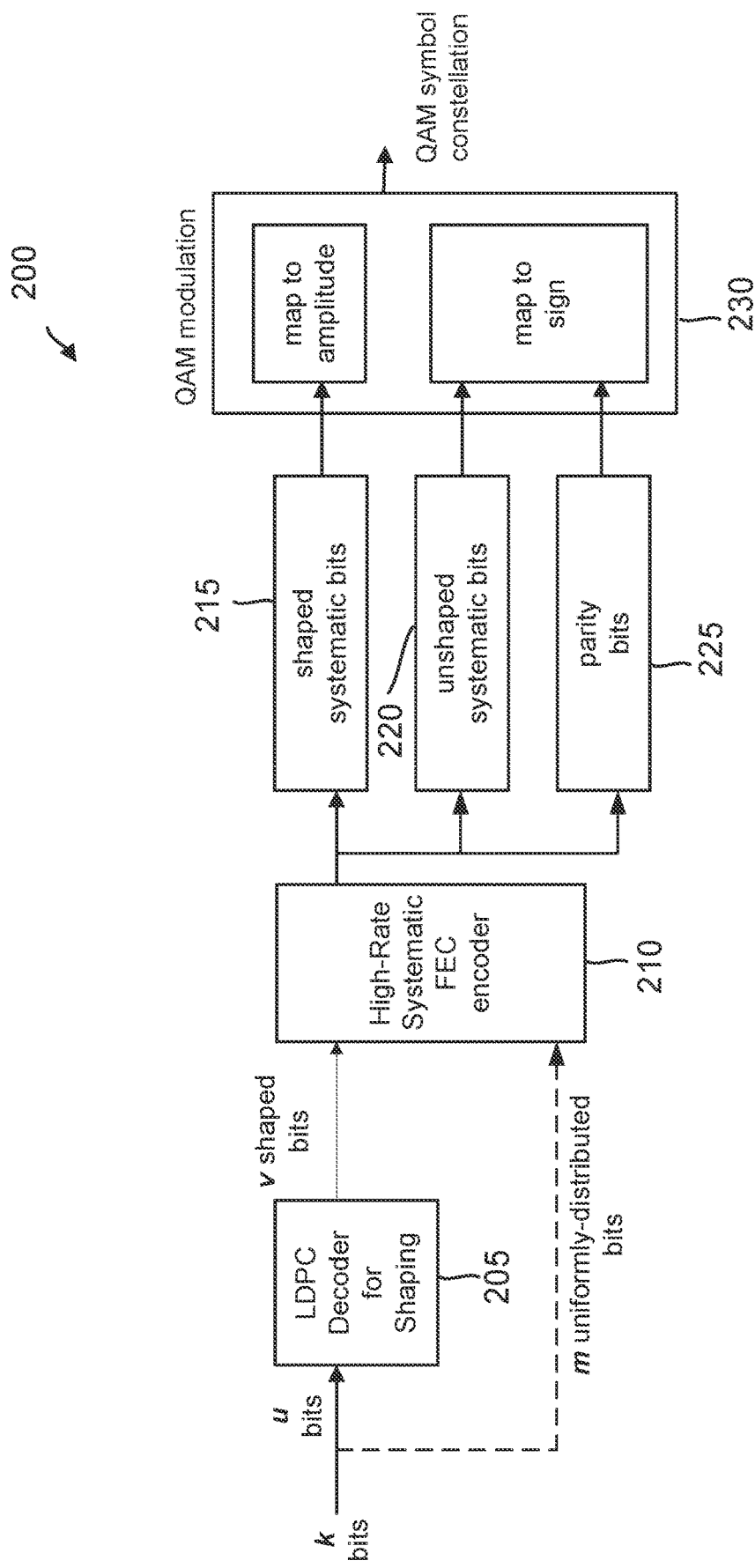
FIG. 2 is a diagram of an example transmitter configured to practice code-based shaping of uniformly-distributed bits to form non-uniformly-distributed bits according to an aspect of the disclosure.

With reference to FIG. 2, an example transmitter 200 is shown in which a linear-code-based decoder 205 shapes a plurality of u uniformly-distributed information bits into a plurality of v shaped bits (u and v both being plural positive integers with v>u). In the following discussion, it will be assumed that the linear code is a low-density parity-check code without loss of generality. In addition, vectors such as v and u are represented herein using bolded and italicized lower-case letters. It will be appreciated that the decoder 205 (e.g., an LDPC decoder) processes the plurality of u uniformly-distributed information bits in parallel. In this fashion, transmitter 200 advantageously does not suffer from the relatively-high latency from sequential bit-by-bit processing of information bits. Transmitter 200 may thus better support high-speed data communication.

The plurality of u uniformly-distributed information bits are selected from a plurality of k information bits, where k≥u. An optional remainder m of the k information bits are not shaped (m being equal to k−u). A systematic forward error correction (FEC) encoder 210 encodes the v shaped bits and the m uniformly-distributed bits into shaped systematic bits 215, unshaped systematic bits 220 and parity bits 225. The m bits may be punctured bits that are processed in the FEC encoder 210. Transmitter 200 then applies QAM modulation 230 by mapping the shaped systematic bits 215 to the amplitude of non-uniformly distributed QAM symbols. The parity bits 225 and the unshaped systematic bits 220 are mapped to the sign of the QAM symbols. In this fashion, transmitter 200 converts the k information bits to a QAM symbol constellation with probabilistic amplitude shaping.

With regard to the generation of the v shaped bits, LDPC decoder 205 decodes v from u such that the following Equation (1) is satisfied:

$$Hv = u \qquad \text{Eq. (1)}$$

where H is a low-density parity-check matrix having L rows and N columns, L and N being plural positive integers. Since there are L rows to the matrix H, there are L uniformly distributed bits in the plurality of uniformly-distributed bits u, ranging from a first bit $u_1$ to an Lth bit $u_L$. Similarly, there are N shaped bits in the plurality of shaped bits v, ranging from a first bit $v_1$ to an Nth bit $v_N$. The shaped bits v are the output of the LDPC decoding. But note that the linear equations defined by Equation (1) are underdetermined. There are thus many different ways to construct the shaped bits v such that Equation (1) is satisfied. What is remarkable about the LDPC decoding disclosed herein is that Equation (1) is exploited so that distribution of binary ones and zeroes in the shaped bits v satisfies the desired non-uniform distribution. In that regard, the distribution of binary ones and binary zeroes in a uniformly-distributed set of bits such as the set k of information bits is expected to result in one-half of the bits being binary ones and the other half being binary zeroes (as the dimension of k is increased). But in the non-uniformly distributed shaped bits v, the likelihood of a binary zero is not equal to the likelihood of a binary one. More generally, should a non-binary LDPC decoder be used, the various characters in the code do not have equal likelihoods of being transmitted. Thus, although the following discussion will use examples of binary LDPC decoders, it will be appreciated that the LDPC-code-based shaping disclosed herein is generally applicable to both binary and non-binary codes. It will also be appreciated that the matrix H may be generalized to be the generator matrix of a linear code. In such an implementation, decoder 205 may be an LDGM decoder.

In the non-uniform distribution of the shaped bits v, the probability or likelihood of a binary zero may be represented by a probability $p_0$, where p≠0.50. Note that in a uniform distribution, $p_0$ would be expected to equal 0.5 (a 50% likelihood). Since the shaped bits v have a non-uniform distribution, one of the binary values (either the binary zero or the binary one) will be more likely than the other binary value. It is arbitrary which binary value is the more likely but in the following discussion, it will be assumed that the binary zero is the more likely. The likelihood of a binary zero in the shaped bits v will be designated by the variable $p_0$ as noted earlier whereas the probability of a binary one is designated by $(1-p_0)$. Given these complementary probabilities, it is advantageous to begin decoding the uniform bits u into the shaped bits v by assigning an initial log likelihood ratio (LLR) to each shaped bit as given by the following Equation (2):

$$LLR = \text{Log}(p_0/(1-p_0)) \quad \text{Eq. (2)}$$

Figure 3:
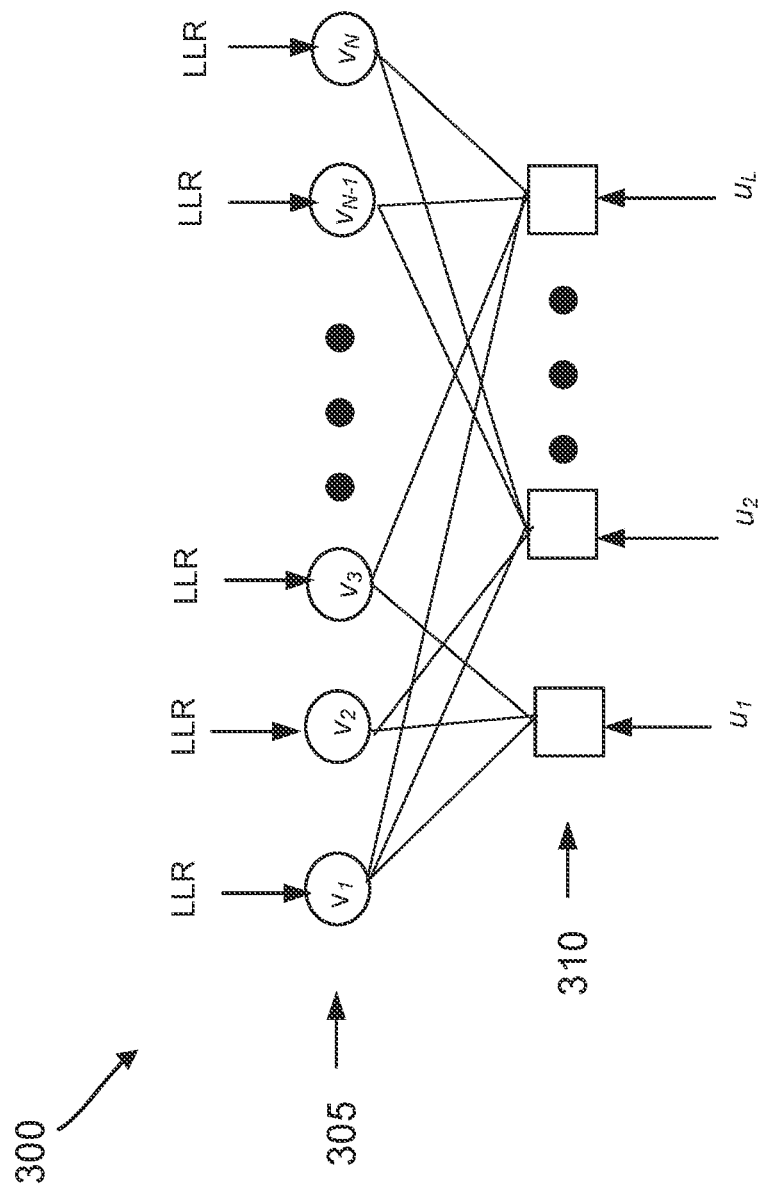
FIG. 3 is an example Tanner graph for the low-density parity-check decoder in the transmitter of FIG. 2 in which each variable node is initialized to an unconditional log likelihood ratio in accordance with an aspect of the disclosure.

With respect to this decoding according to the LLRs, it is convenient to illustrate it conceptually using a Tanner graph. An example Tanner graph 300 is shown in FIG. 3. The plurality of N shaped bits v are represented by a set of variable nodes 305, ranging from a first variable node for a first shaped bit $v_1$ to an Nth variable node for an Nth shaped bit $v_N$. LDPC decoder 205 (FIG. 2) will eventually assign either a binary zero or a binary one value to each variable node but begins the decoding with each shaped bit being equal to the LLR as defined in Equation (2). The uniformly-distributed bits u are represented by the check nodes 310. Since there are L uniformly-distributed bits, the check nodes range from a first check node for a first bit $u_1$ to an Lth check node for an Lth bit $u_L$.

The relationship between the non-uniformly-distributed bits and the uniformly-distributed bits is set by the parity check matrix H. For example, the first shaped bit $v_1$ equals a sum of the first, second, and Lth uniformly-distributed bits. In that regard, the parity matrix H may be deemed to define a check equation for the first shaped bit $v_1$. The Tanner graph 300 illustrates this linear relationship by corresponding lines between the first variable node and the first, second, and Lth check nodes. The check equations and the linear relationship between the remaining variable nodes and the check nodes is analogous and depends upon the parity check matrix H.

It may be seen that the decoding with respect to the values of the uniformly-distributed bits u to calculate the shaped bits v stands in contrast to the conventional decoding by, for example, a 5G LDPC decoder. In that regard, a typical LDPC encoder encodes information bits into coded bits c according to an LDPC matrix H such that Hc=0. The check equation for each decoded bit thus equals zero in such an implementation. An LDPC decoder of the coded bits c would then decode such that the check nodes (if conceptually viewed as a Tanner graph) are all set to zero. But an LDPC decoder of the uniformly-distributed bits u has varying non-zero values for the check nodes depending upon the binary value of each bit u. To allow LDPC encoder 205 to function with the check equations all equal to zero as would occur in a 5G LDPC decoder, an equivalent parity check matrix H' is constructed that equals the concatenation of the parity check matrix H with an L×L identity matrix I such that H'=[H,I]. LDPC encoder 205 may then be configured to solve the following equation (3):

$$[H'][v, u]^T = 0 \quad \text{Eq. (3)}$$

where T stands for the transpose operation and 0 is a zero vector of dimension L. Equation (3) may be expanded to be become Hv+Iu=u+u=0. As compared to the parity check matrix H, the expanded parity check matrix H' has L more columns. The check nodes may thus be set to zero at the cost of increased encoding complexity and latency. With respect to calculating the vector [v, u] the uniformly-distributed bits u are of course already known. The initial probability for the variable nodes (in a Tanner graph representation) corresponding to the uniformly-distributed bits u may thus be set to a very large number having a positive or negative sign depending upon the binary value of the corresponding bit in the set u. However, the initial probability for the variable nodes corresponding to the shaped bits v may be set according to the LLR of Equation (2).

To avoid the increase in computation complexity and latency from using the expanded parity check matrix H', LDPC decoder 205 may instead be configured to subdivide the parity check matrix H so that it equals the concatenation $[H_1, H_2]$ of a first parity check matrix $H_1$ and a second parity check matrix $H_2$. Similarly, the plurality of non-uniformly-distributed bits v is subdivided into a concatenation of a first plurality of shaped bits $v_1$ and a second plurality of shaped bits $v_2$. Parity check matrix $H_1$ equals the first N-L columns of the parity check matrix H. Parity check matrix $H_1$ thus has L rows and N-L columns. Recall that L is the number of bits in the set of uniformly-distributed bits u whereas N is the number of bits in the set of shaped bits v. Parity check matrix $H_2$ equals the final L columns of the parity check matrix H. The parity check matrix $H_2$ thus has L rows and L columns. With this terminology in mind, Equation (1) may be manipulated as shown in the following Equation (4):

$$0 = Hv + u = [H_1, H_2][v_1, v_2]^T + H_2^{-1}u = [H_1, H_2][v_1, H_2^{-1}u + v_2]^T \quad \text{Eq. (4)}$$

where $H_2^{-1}$ is the inverse of the $H_2$ matrix. Advantageously, the LDPC decoder 205 may then decode with respect to the parity check matrix [H1, H2], which has the same dimensions as does the parity check matrix H and thus lowers the computation complexity and latency as compared to the use of Equation (3). With respect to a Tanner graph of such an LDPC decoding, the first N-L variable nodes are set to the LLR from Equation (2). However, the final L variable nodes may be deemed to be "masked" by the product $H_2^{-1}u$ as will be discussed further herein. But the check nodes may all be set to zero as occurs with Equation (3).

After decoding according to Equation (4), the LDPC decoder 205 produces a length-N vector $[v_1, v_2']$, where $v_2'$ may be denoted as a first vector equaling $H_2^{-1}u+v_2$. The LDPC decoder 205 may then recover $v_2$ using the sum $v_2+H_2^{-1}u$. Existing LDPC encoders such as a 5G LDPC encoder may be exploited to calculate the inverse matrix $H_2^{-1}$. In that regard, a double-diagonal structure (also denoted as a degree-2 encoding chain) for $H_2$ such as used in Base Graph 1 (BG1) or Base Graph 2 (BG2) of the 5G LDPC will greatly simplify the computation of $H_2^{-1}$ from $H_2$.

Figure 4:
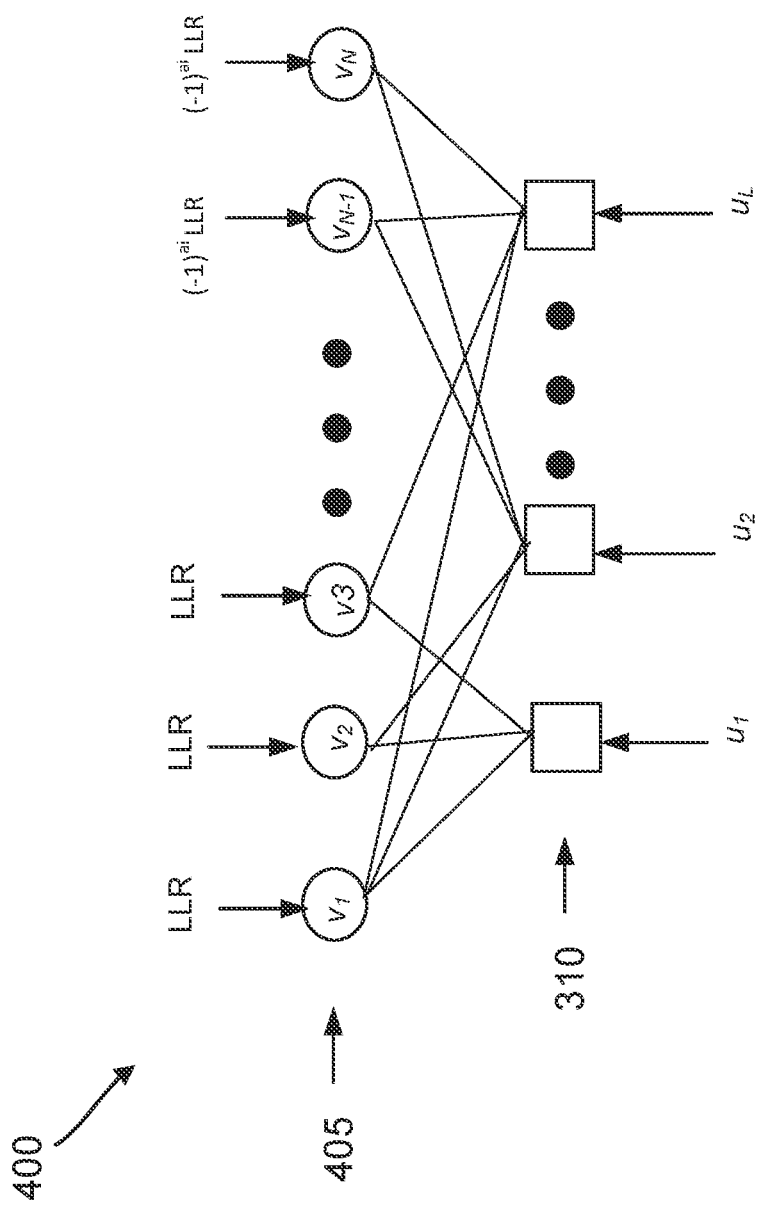
FIG. 4 is an example Tanner graph for the low-density parity-check decoder in the transmitter of FIG. 2 in which each variable node is initialized to a conditional log likelihood ratio in accordance with an aspect of the disclosure.

An example Tanner graph 400 for LDPC decoding according to Equation (4) is shown in FIG. 4. The check nodes 310 are as discussed for Tanner graph 300 and are set according to the corresponding uniformly-distributed bits u. But the variable nodes 405 are subdivided according to the vectors $v_1$ and $v_2'$. In particular, the first N-L variable nodes 405 are initialized to equal the LLR of Equation (2). These first N-L variable nodes thus correspond to the N-L bits in $v_1$. The final L variable nodes 405 correspond to the vector $v_2'$. These final L variable nodes may be deemed to be indexed or arranged from one to L. Similarly, the vector formed by the product of $H_2^{-1}u$ may also be deemed to have its bits indexed or arranged from one to L. The ith bit of this vector may thus be denoted as $a_i$ and will be either a binary zero or a binary one. Should this ith bit be a binary zero, its addition to the corresponding bit from $v_2$ does not change the sign of the resulting sum. But if the ith bit is a binary one, its addition to the corresponding bit from $v_2$ changes the sign of the resulting sum. Thus, the final L variable nodes may be initialized to equal the product $(-1)^{a_i}*LLR$.

Figure 5:
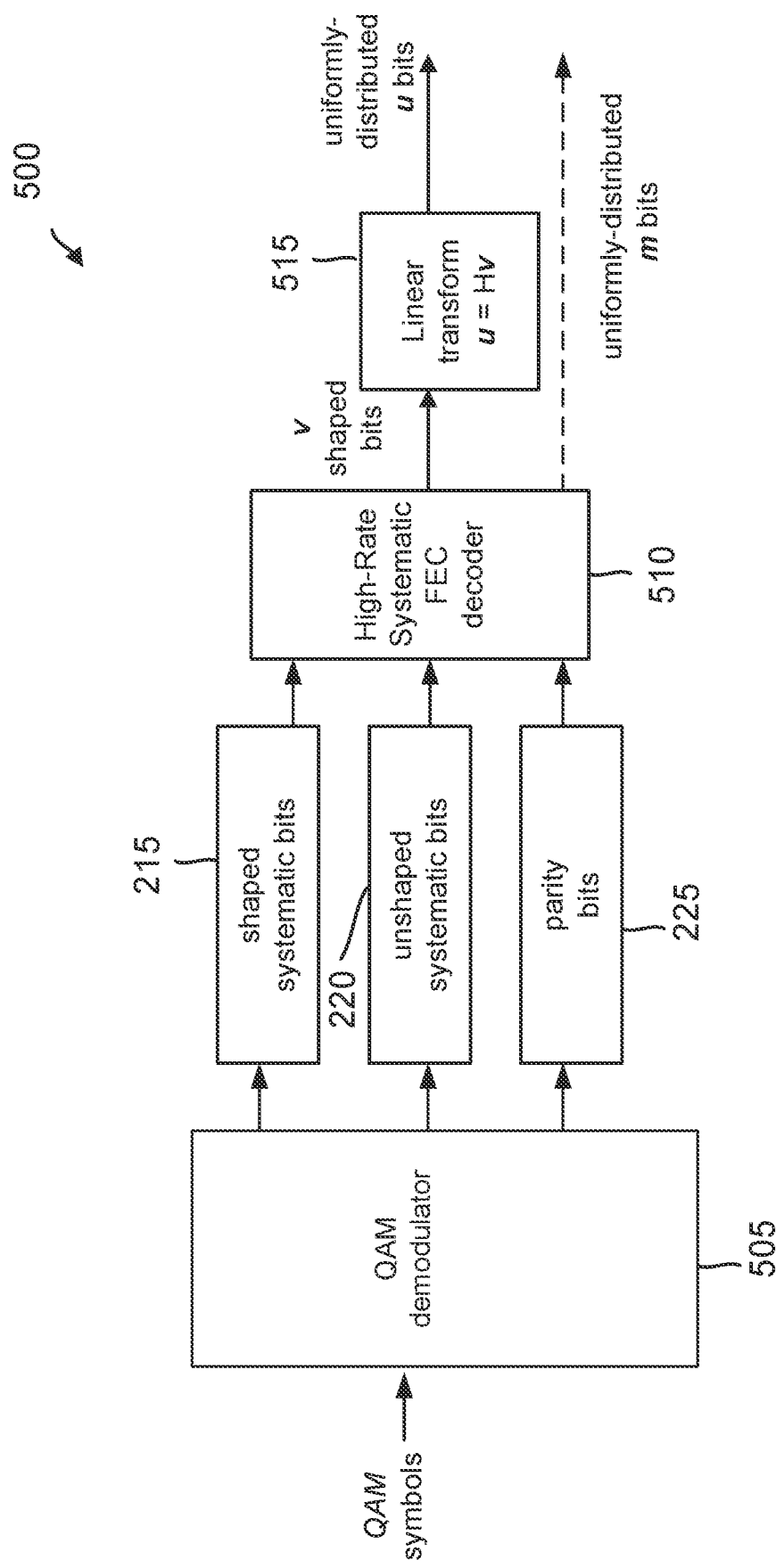
FIG. 5 is a diagram of an example receiver configured to practice code-based de-shaping of non-uniformly-distributed bits to form uniformly-distributed bits according to an aspect of the disclosure.

A receiver 500 for de-shaping and recovering the uniformly-distributed bits u from the transmitted QAM symbols is shown in FIG. 5. A QAM demodulator 505 demodulates the QAM symbols to recover the shaped systematic bits 215, unshaped systematic bits 220 and parity bits 225 discussed with regard to transmitter 200. A high-rate systematic FEC decoder 510 decodes the shaped systematic bits 215, unshaped systematic bits 220 and parity bits 225 to recover the shaped bits v and the (optional) m uniformly-distributed bits m. The receiver 500 applies a linear transform 515 of multiplying the shaped bits v with the parity check matrix H to recover the uniformly-distributed bits u (note that the parity check matrix H was used by the transmitter for shaping). Note further that an LDPC decoder such as used in 5G that functions to recover a vector of information bits c through the relationship of Hc=0 will generally be configured for an analogous linear transformation such as used in parity-check-based early termination. An existing LDPC decoder may thus be configured to implement the linear transformation 515 represented by the product Hv.

With the transmitter 200 and receiver 500 having been discussed, some additional aspects of the linear-code-based shaping and de-shaping will now be addressed. For example, should one or more of the information bits in the vector v be punctured, these punctured bits may then be excluded from the shaping 215 into the shaped systematic bits. The decoder 510 in the receiver 500 would then need to recover the punctured shaped bits, Since the receiver 500 should recover the punctured bits, this recovery may be performed using, for example, hard decision decoding. With the punctured shaped bits recovered, the receiver 500 may then proceed to perform the linear transformation of Hv as discussed earlier to recover the uniformly-distributed bits u.

Alternatively, the punctured bits in the vector v may be transmitted as part of the unshaped systematic bits 220 in a second implementation. In that case, the punctured bits would be uniformly-distributed but the remainder of the shaped bits v may have a non-uniform distribution according to their shaping. Finally, in a third implementation, the transmitter 200 and the receiver 500 may both use a linear code such an LDPC code without any puncturing. Note that the puncturing described above is with respect to punctured nodes for shaping and is distinct from puncturing that may be performed in the FEC 510 for channel coding.

Referring again to Equation (2) and the corresponding Tanner graph 300, note that the shaping is unconditional in that each shaped bit is initialized to equal the same LLR. But it will be appreciated that such an unconditional shaping may be extended to conditional shaping implementations. In this fashion, the non-uniform vector v may have differing distributions for its various bits. For example, a first set of variable nodes may be initialized to a first LLR ($LLR_1$) whereas a second set of variable nodes may be initialized to a second LLR ($LLR_2$). Similarly, one LDPC code may be used to jointly shape multiple bit levels corresponding to the same modulation symbol. For example, the three amplitude bits mapping to the same amplitude in a 256 QAM system may be jointly shaped. Alternatively, several LDPC codes may be used to shape different bits that map to the same point in the QAM constellation.

As noted earlier, the code-based shaping disclosed herein may be implemented regardless of whether the code is binary or non-binary. For example, a non-binary LDPC code may be beneficial for higher order modulations (e.g., greater than 16 QAM) where more than one bit per constellation point is shaped. In such an implementation, the bits corresponding to the same constellation point may be grouped so as to be shaped together according to a q-ary code such as a q-ary LDPC code. For example, q equals 4, 8, and 16, respectively for 64 QAM, 256 QAM, and 1024 QAM. Regardless of the degree of the q-ary code, transmitter 200 may proceed to decode the uniformly-distributed vector u to obtain a q-ary shaped vector v such that Hv=u as discussed previously. The receiver 500 may then decode the vector v and recover the q-ary information vector u from the same relation Hv=u. The resulting use of a q-ary code results in a distribution that more closely approaches the optimal Maxwell Boltzmann distribution.

Figure 6:
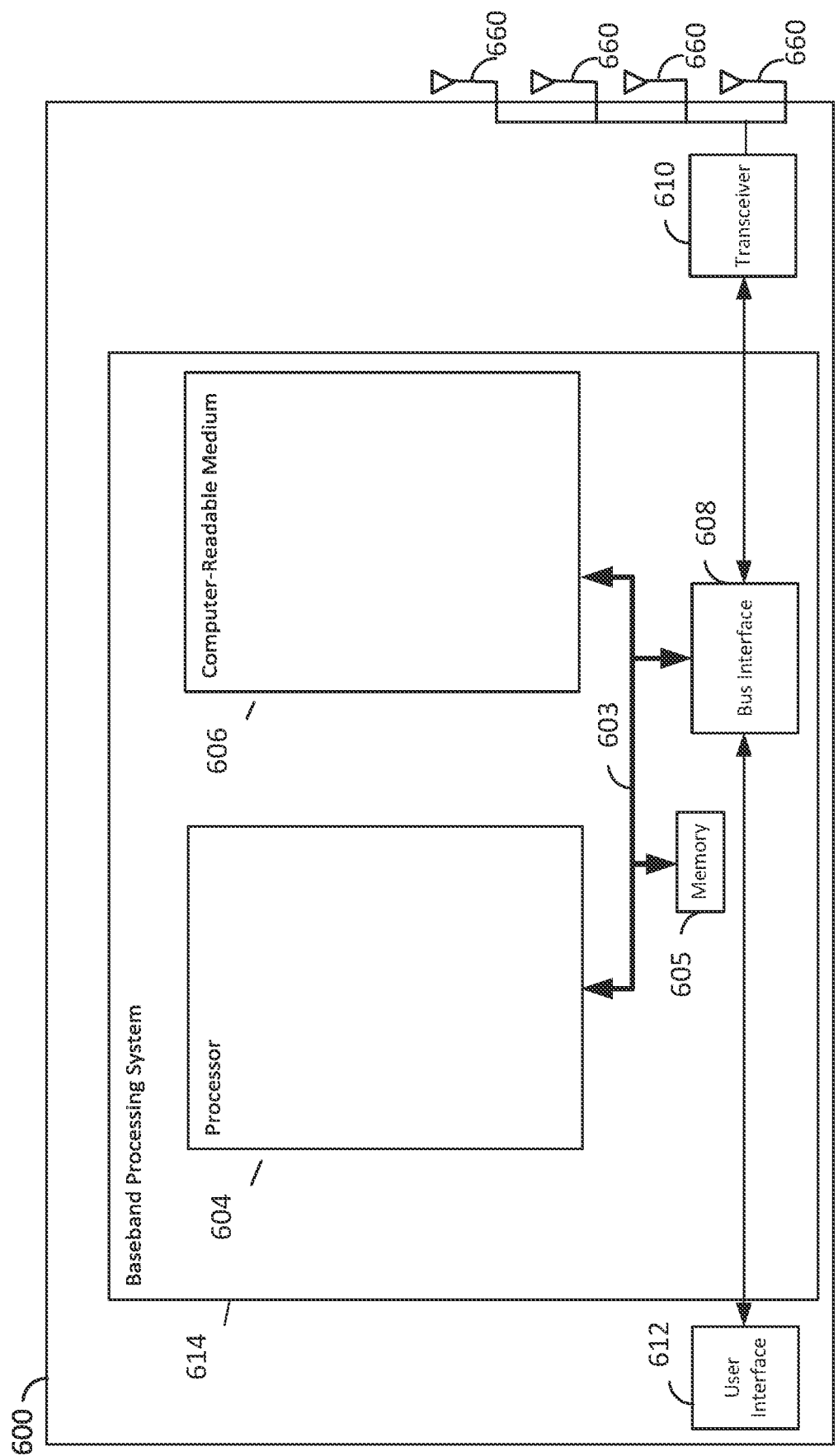
FIG. 6 illustrates an example architecture for a network node in the system of FIG. 1 in accordance with an aspect of the disclosure.

Transmitter 200 and receiver 500 may be incorporated into any suitable network node such as the base stations 108 and the UEs 106 discussed with regard to FIG. 1. An example network node 600 is shown in more detail in FIG. 6 that is generic to a UE or a base station for the implementation of the enhanced code-based shaping and de-shaping disclosed herein. Network node 600 includes a baseband processing system 614 having a bus interface 608, a bus 602, memory 605, an at least one processor 604, and a computer-readable medium 606. Furthermore, node 600 may include a user interface 612 and a transceiver 610. Transceiver 610 transmits and receives through an array of antennas 660. Transmitter 200 and receiver 500 may each be implemented by a combination of the baseband processing system 614, transceiver 610, and antennas 660.

The processor(s) 604 is also responsible for managing the bus 602 and general processing, including the execution of software stored on the computer-readable medium 606. The software, when executed by the processor 604, causes the baseband processing system 614 to perform the enhanced code-based shaping and de-shaping disclosed herein. By executing the software, processor 604 may thus function, for example, as the decoder 205 and the encoder 210 in transmitter 200, and also as the decoder 510 in receiver 500. Alternatively, the network node 600 may include one or more application specific integrated circuits (ASICs) or field programmable gate arrays (FPGAs) that may be configured to implement the decoder 205, the encoder 210, and the decoder 510.

The bus 602 may include any number of interconnecting buses and bridges depending on the specific application of the baseband processing system 614 and the overall design constraints. The bus 602 communicatively couples together various circuits including one or more processors (represented generally by the processor 604), the memory 605, and computer-readable media (represented generally by the computer-readable medium 606). The bus 602 may also link various other circuits such as timing sources, peripherals, voltage regulators, and power management circuits, which are well known in the art, and therefore, will not be described any further. The bus interface 608 provides an interface between the bus 602 and the transceiver 610. The transceiver 610 provides a communication interface or means for communicating with various other apparatus over a transmission medium. Depending upon the nature of the apparatus, a user interface 612 (e.g., keypad, display, speaker, microphone, joystick) may also be provided.

The disclosure will now be summarized in a series of clauses:

Clause 1. A transmitter, comprising:
  a decoder configured to decode a plurality of non-uniformly-distributed bits from a plurality of uniformly-distributed information bits so that a product of the plurality of non-uniformly-distributed bits with a parity check matrix for a linear code equals the plurality of uniformly-distributed information bits.

Clause 2. The transmitter of clause 1, wherein the linear code is a low-density parity-check code and the decoder is a low-density parity-check decoder.

Clause 3. The transmitter of any of clauses 1-2, further comprising:
  a forward error correction encoder configured to encode the plurality of non-uniformly-distributed bits into a plurality of shaped systematic bits and a plurality of parity bits.

Clause 4. The transmitter of clause 3, further comprising:
  a quadrature amplitude modulator configured to map the plurality of shaped systematic bits and the plurality of parity bits into a plurality of quadrature amplitude modulation symbols.

Clause 5. The transmitter of clause 1, wherein the linear code is a low-density linear-generator-matrix code and the decoder is a low-density linear-generator-matrix decoder.

Clause 6. The transmitter of any of clauses 1-5, wherein the transmitter is included within a network device.

Clause 7. The transmitter of any of clauses 1-5, wherein the transmitter is included within a user equipment.

Clause 8. The transmitter of any of clauses 1-7, wherein the decoder is configured to begin a conversion of the plurality of uniformly-distributed information bits into the plurality of non-uniformly-distributed bits with each non-uniformly-distributed bit being initialized to a log likelihood ratio.

Clause 9. The transmitter of clause 8, wherein the log likelihood ratio equals log $(p_0/(1-p_0))$, wherein $p_0$ is a likelihood of a binary zero in the plurality of non-uniformly-distributed bits, and wherein $p_0$ does not equal one-half.

Clause 10. The transmitter of clause 8, wherein the log likelihood ratio is an unconditional log likelihood ratio, the unconditional log likelihood ratio being equal for each non-uniformly-distributed bit.

Clause 11. The transmitter of clause 8, wherein the log likelihood ratio is a conditional log likelihood ratio, the conditional log likelihood ratio varying across the plurality of non-uniformly-distributed bits.

Clause 12. The transmitter of any of clauses 1-7, wherein the decoder is configured to decode according to an equivalent parity check matrix that equals a concatenation of the parity check matrix and an identity matrix such that a product of the equivalent parity check matrix with a concatenation of the plurality of non-uniformly-distributed bits and the plurality of uniformly-distributed bits equals a zero vector.

Clause 13. The transmitter of any of clauses 1-7, wherein the parity check matrix equals a concatenation of a first parity check matrix and a second parity check matrix and the plurality of non-uniformly-distributed bits equals a concatenation of a first plurality of shaped bits and a second plurality of shaped bits, and wherein the decoder is configured to decode using a first calculation of a first vector equaling a concatenation of the first plurality of shaped bits and a sum of a product of an inverse of the second parity check matrix and the plurality of uniformly-distributed bits and the second plurality of shaped bits.

Clause 14. The transmitter of clause 13, wherein the decoder is further configured to recover the plurality of non-uniformly-distributed bits by an addition of the product of the inverse of the second parity check matrix and the plurality of uniformly-distributed bits to the first vector.

Clause 15. A receiver, comprising:
  a low-density parity-check encoder configured to multiply a plurality of non-uniformly-distributed bits with a parity check matrix for a low-density parity-check code to form a plurality of uniformly-distributed bits.

Clause 16. The receiver of clause 15, further comprising:
  a forward error correction decoder configured to decode a plurality of shaped systematic bits and a plurality of parity bits to form the plurality of non-uniformly-distributed bits.

Clause 17. The receiver of clause 16, further comprising:
  a quadrature amplitude demodulator configured to demodulate a plurality of quadrature amplitude modulation symbols to form the plurality of shaped systematic bits and the plurality of parity bits.

Clause 18. A method of shaping a plurality of uniformly-distributed bits, comprising:
  decoding a plurality of non-uniformly-distributed bits from the plurality of uniformly-distributed bits so that a product of the non-uniformly-distributed bits with a parity check matrix for a linear code equals the plurality of uniformly-distributed bits.

Clause 19. The method of clause 18, further comprising forward error encoding the plurality of non-uniformly-distributed bits into a plurality of shaped systematic bits and into a plurality of parity bits.

Clause 20. The method of clause 19, further comprising:
  mapping the plurality of shaped systematic bits and the plurality of parity bits into a plurality of quadrature amplitude modulation symbols.

Clause 21. The method of clause 20, further comprising:
  transmitting the plurality of quadrature amplitude modulation symbols to a remote receiver.

Clause 22. The method of any of clauses 18-21, further comprising:
  puncturing an at least one bit from a plurality of information bits to form the plurality of uniformly-distributed bits.

Clause 23. The method of clause 22, wherein the decoding recovers the punctured at least one bit in the plurality of non-uniformly-distributed bits.

Clause 24. The method of any of clauses 18-23, wherein the decoding begins by setting each non-uniformly-distributed bit equal to a log likelihood ratio.

Clause 25. The method of clause 24, wherein the log likelihood ratio is equal for each non-uniformly-distributed bit.

Clause 26. A transmitter, comprising:
  a decoder configured to decode a plurality of non-uniformly-distributed non-binary symbols from a plurality of uniformly-distributed non-binary information symbols so that a product of the plurality of non-uniformly-distributed non-binary symbols with a parity check matrix for a linear code equals the plurality of uniformly-distributed non-binary information symbols.

Clause 27. The transmitter of clause 26, wherein the plurality of non-uniformly-distributed non-binary symbols comprise q-ary symbols, wherein q equals $2^m$ and m is a plural positive integer.

Clause 28. The transmitter of clause 27, further comprising
a quadrature amplitude modulator configured to map the q-ary symbols into a plurality of quadrature amplitude modulation symbols.

Clause 29. The transmitter of clause 26, wherein the linear code is a low-density parity-check code.

Clause 30. The transmitter of clause 26, wherein the linear code is a low-density generator-matrix code.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A transmitter, comprising:
a low-density parity-check decoder configured to decode a plurality of non-uniformly-distributed bits from a plurality of uniformly-distributed information bits;
a forward error correction encoder configured to encode the plurality of non-uniformly-distributed bits into a plurality of shaped systematic bits and a plurality of parity bits; and
a quadrature amplitude modulator configured to map the plurality of shaped systematic bits and the plurality of parity bits into a plurality of quadrature amplitude modulation symbols.

2. The transmitter of claim 1, wherein the transmitter is included within a network device.

3. The transmitter of claim 1, wherein the transmitter is included within a user equipment.

4. The transmitter of claim 1, wherein the low-density parity-check decoder is configured to begin a conversion of the plurality of uniformly-distributed information bits into the plurality of non-uniformly-distributed bits with each non-uniformly-distributed bit being initialized to a log likelihood ratio.

5. The transmitter of claim 4, wherein the log likelihood ratio equals $\log(p_0/(1-p_0))$, wherein $p_0$ is a likelihood of a binary zero in the plurality of non-uniformly-distributed bits, and wherein $p_0$ does not equal one-half.

6. The transmitter of claim 4, wherein the log likelihood ratio is an unconditional log likelihood ratio, the unconditional log likelihood ratio being equal for each non-uniformly-distributed bit.

7. The transmitter of claim 4, wherein the log likelihood ratio is a conditional log likelihood ratio, the conditional log likelihood ratio varying across the plurality of non-uniformly-distributed bits.

8. The transmitter of claim 1, wherein the low-density parity-check decoder is configured to decode according to an equivalent parity check matrix that equals a concatenation of a parity check matrix and an identity matrix such that a product of the equivalent parity check matrix with a concatenation of the plurality of non-uniformly-distributed bits and the plurality of uniformly-distributed bits equals a zero vector.

9. The transmitter of claim 1, wherein the parity check matrix equals a concatenation of a first parity check matrix and a second parity check matrix and the plurality of non-uniformly-distributed bits equals a concatenation of a first plurality of shaped bits and a second plurality of shaped bits, and wherein the low-density parity-check decoder is configured to decode using a first calculation of a first vector equaling a concatenation of the first plurality of shaped bits and a sum of a product of an inverse of the second parity check matrix and the plurality of uniformly-distributed bits and the second plurality of shaped bits.

10. The transmitter of claim 9, wherein the low-density parity-check decoder is further configured to recover the plurality of non-uniformly-distributed bits by an addition of the product of the inverse of the second parity check matrix and the plurality of uniformly-distributed bits to the first vector.

11. A receiver, comprising:
a quadrature amplitude demodulator configured to demodulate a plurality of quadrature amplitude modulation symbols to form a plurality of shaped systematic bits and a plurality of parity bits;
a forward error correction decoder configured to decode the plurality of shaped systematic bits and the plurality of parity bits to form a plurality of non-uniformly-distributed bits; and
a low-density parity-check encoder configured to recover a plurality of uniformly-distributed bits from the plurality of non-uniformly-distributed bits.

12. A method of shaping a plurality of uniformly-distributed bits, comprising:
decoding a plurality of non-uniformly-distributed bits from a plurality of uniformly-distributed bits in a low-density parity check encoder;
forward error encoding the plurality of non-uniformly-distributed bits into a plurality of shaped systematic bits and into a plurality of parity bits; and
mapping the plurality of shaped systematic bits and the plurality of parity bits into a plurality of quadrature amplitude modulation symbols.

13. The method of claim 12, further comprising:
transmitting the plurality of quadrature amplitude modulation symbols to a remote receiver.

14. The method of claim 12, further comprising:
puncturing an at least one bit from a plurality of information bits to form the plurality of uniformly-distributed bits.

15. The method of claim 14, wherein the decoding recovers the punctured at least one bit in the plurality of non-uniformly-distributed bits.

16. The method of claim 12, wherein the decoding begins by setting each non-uniformly-distributed bit equal to a log likelihood ratio.

17. The method of claim 16, wherein the log likelihood ratio is equal for each non-uniformly-distributed bit.

18. A transmitter, comprising:
a low-density parity check decoder configured to decode a plurality of non-uniformly-distributed non-binary symbols from a plurality of uniformly-distributed non-binary information symbols, wherein the plurality of non-uniformly-distributed non-binary symbols comprise q-ary symbols, wherein q equals $2^m$ and m is a plural positive integer; and a quadrature amplitude modulator configured to map the q-ary symbols into a plurality of quadrature amplitude modulation symbols.

* * * * *